US 12,153,826 B2

(12) United States Patent
Jang

(10) Patent No.: US 12,153,826 B2
(45) Date of Patent: Nov. 26, 2024

(54) MEMORY SYSTEM AND OPERATING METHOD THEREOF

(71) Applicant: SK hynix Inc., Gyeonggi-do (KR)

(72) Inventor: In Jong Jang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 4 days.

(21) Appl. No.: 17/882,230

(22) Filed: Aug. 5, 2022

(65) Prior Publication Data

US 2023/0214151 A1 Jul. 6, 2023

(30) Foreign Application Priority Data

Jan. 5, 2022 (KR) .................. 10-2022-0001761

(51) Int. Cl.
*G06F 3/06* (2006.01)
(52) U.S. Cl.
CPC .......... *G06F 3/0655* (2013.01); *G06F 3/0604* (2013.01); *G06F 3/0679* (2013.01)
(58) Field of Classification Search
None
See application file for complete search history.

(56) References Cited

U.S. PATENT DOCUMENTS

| | | | | |
|---|---|---|---|---|
| 8,078,908 B2* | 12/2011 | Tojo | ................ | G06F 21/77 714/24 |
| 9,195,397 B2* | 11/2015 | Winokur | ............. | G06F 11/2058 |
| 9,395,923 B1* | 7/2016 | Pandolfo | ................ | G06F 11/00 |
| 9,575,844 B2* | 2/2017 | Danilak | ............. | G06F 11/1456 |
| 2005/0283655 A1* | 12/2005 | Ashmore | ............ | G06F 11/1092 714/6.32 |
| 2014/0149787 A1* | 5/2014 | Shanbhag | ........... | G06F 11/1662 714/6.22 |
| 2018/0107553 A1* | 4/2018 | Leggette | ............. | G06F 11/1662 |
| 2019/0324859 A1* | 10/2019 | Armstrong | ............. | G11C 29/52 |
| 2020/0409805 A1 | 12/2020 | Kim et al. | | |
| 2021/0110865 A1 | 4/2021 | Gopalakrishnan et al. | | |
| 2022/0254415 A1* | 8/2022 | Arora | ................ | G11C 16/26 |

FOREIGN PATENT DOCUMENTS

| | | | |
|---|---|---|---|
| KR | 10-2011-0065757 A | | 6/2011 |
| KR | 10-2177917 B1 | | 11/2020 |

* cited by examiner

*Primary Examiner* — Elias Mamo
(74) *Attorney, Agent, or Firm* — IP & T GROUP LLP

(57) ABSTRACT

A memory system includes a non-volatile memory device and a controller. The non-volatile memory device includes a first memory region and a second memory region. The controller stores, into the second memory region, copied data of original data stored in the first memory region and an address of the first memory region while storing, into the first memory region, an address of the second memory region, when detecting occurrence of a critical event.

15 Claims, 8 Drawing Sheets

MEMORY SYSTEM AND OPERATING METHOD THEREOF

CROSS-REFERENCES TO RELATED APPLICATION

The present application claims priority under 35 U.S.C. § 119(a) to Korean patent application number 10-2022-0001761, filed on Jan. 5, 2022, which is incorporated herein by reference in its entirety as if set forth in full.

BACKGROUND

1. Technical Field

Various embodiments of the present disclosure are related to a memory system, and more particularly, to a memory system including a non-volatile memory device.

2. Related Art

A memory system may be configured to store data provided by a host device in response to a write request from the host device. Furthermore, the memory system may be configured to provide stored data to the host device in response to a read request from the host device. The host device is an electronic device capable of processing data and may include a computer, a digital camera or a mobile phone. The memory system may be mounted in the host device or may be fabricated to be capable of being connected to and detached from the host device.

According to a number of bits that can be stored in a memory cell included in a non-volatile memory device, the memory cell may operate as a single level cell (SLC), a multi-level cell (MLC), a triple level cell (TLC), a quadruple level cell (QLC) and so forth. Data may be more stably stored in a memory cell as a number of bits which can be stored in the memory cell, become smaller.

SUMMARY

In an embodiment of the present disclosure, a memory system may include a non-volatile memory device and a controller. The non-volatile memory device may include a first memory region and a second memory region. The controller may be configured to store, into the second memory region, copied data of original data stored in the first memory region and an address of the first memory region while storing, into the first memory region, an address of the second memory region, when detecting occurrence of a critical event.

In an embodiment of the present disclosure, a memory system may include a non-volatile memory device and a controller. The non-volatile memory device may include a first memory region and a second memory region. The controller may be configured to store, into the second memory region, copied data of original data stored in the first memory region; recover, when the first memory region and the second memory region have the same reliability, the original data by comparing first data that is read from the first memory region with second data that is read from the second memory region; and keep the second data while deleting the original data when the second memory region has higher reliability than the first memory region.

In an embodiment of the present disclosure, an operating method of a memory system may include performing a copy operation when detecting occurrence of a critical event. The copy operation may include an operation of storing, into a second memory region, copy information and copied data of original data stored in a first memory region, the copy information including an address of the first memory region, and an operation of storing an address of the second memory region into the first memory region.

In an embodiment of the present disclosure, an operating method of a controller may include controlling a memory device to copy, as second data, first data stored in a first region to store, into a second region, the second data together with an error-correcting code for the second data; recovering, when the first and second regions have the same reliability level, the first data by correcting a difference between the first and second data based on the error-correcting code; and controlling, when the second region has a higher reliability level than the first region, the memory device to remove the first data from the first region.

DETAILED DESCRIPTION

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The drawings are not necessarily to scale and, in some instances, proportions may have been exaggerated in order to clearly illustrate features of the embodiments. The terminology used herein is for the purpose of describing particular embodiments only and is not intended to be limiting of the disclosure.

As used herein, the term "and/or" includes at least one of the associated listed items. It will be understood that when an dement is referred to as being "connected to", or "coupled to" another element, it may be directly on, connected to, or coupled to the other element, or one or more intervening dements may be present. As used herein, singular forms are intended to include the plural forms and vice versa, unless the context clearly indicates otherwise. It will be further understood that the terms "comprises," "comprising," "includes," and "including" when used in this specification, specify the presence of the stated dements and do not preclude the presence or addition of one or more other elements.

Hereinafter, various embodiments of the present disclosure will be described below with reference to the accompanying drawings.

In accordance with an embodiment, provided may be a memory system capable of preventing loss or deformation of data due to a critical event and effectively recovering lost or deformed data, and an operating method of the memory system.

Figure 1:
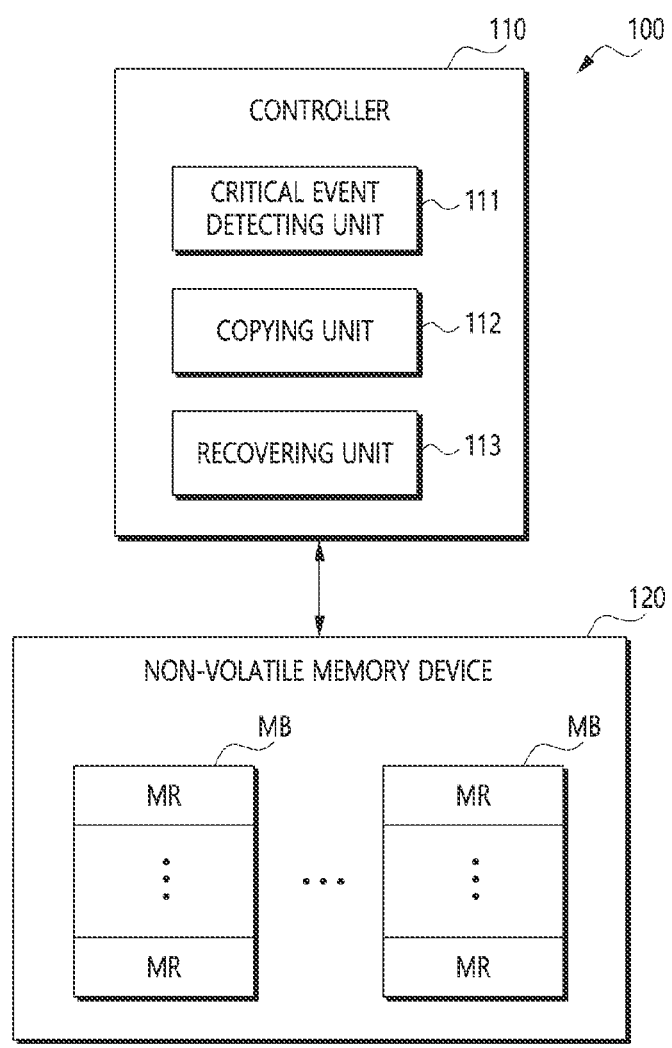
FIG. 1 is a block diagram illustrating a memory system in accordance with an embodiment of the present disclosure.

FIG. 1 is a block diagram illustrating a memory system 100 in accordance with an embodiment of the present disclosure.

The memory system 100 may be configured to store data, which is provided from an external host device, in response to a write request from the host device. The memory system 100 may be configured to provide a host device with data, which is stored therein, in response to a read request from the host device.

The memory system 100 may be configured as a personal computer memory card international association (PCMCIA) card, a compact flash (CF) card, a smart media card, a memory stick, various multimedia cards (e.g., MMC, eMMC, RS-MMC, and MMC-micro), secure digital (SD) cards (e.g., SD, Mini-SD and Micro-SD), a universal flash storage (UFS) or a solid state drive (SSD).

The memory system 100 may include a controller 110 and a non-volatile memory device 120.

The controller 110 may control an overall operation of the memory system 100. The controller 110 may control the non-volatile memory device 120 in order to perform a foreground operation in response to an instruction from a host device. The foreground operation may include operations of writing data in the non-volatile memory device 120 and reading data from the non-volatile memory device 120 in response to instructions from a host device, that is, a write request and a read request.

Furthermore, the controller 110 may control the non-volatile memory device 120 in order to perform an internally necessary background operation independently of a host device. The background operation may include at least one among a wear-leveling operation, a garbage collection operation, an erase operation, a read reclaim operation and a refresh operation for the non-volatile memory device 120. Like the foreground operation, the background operation may include operations of writing data in the non-volatile memory device 120 and reading data from the non-volatile memory device 120.

The controller 110 may perform a copy operation on selected data when detecting the occurrence of a critical event. The controller 110 may perform a recovery operation on the selected data when detecting the resolution of the critical event. The controller 110 may store, during the copy operation, copied data into a memory region MR of high reliability thereby effectively preventing the loss or deformation of original data.

Specifically, the controller 110 may include a critical event detecting unit 111, a copying unit 112 and a recovering unit 113.

The critical event detecting unit 111 may detect the occurrence and resolution of a critical event. A critical event may include a sudden power off, a sudden power decrease, a drastic temperature change beyond a predetermined range and so forth of a host device. The critical event may be resolved when the power is recovered, the temperature becomes stable within the predetermined range and so forth.

In an embodiment, a predetermined bit (e.g., a shut-down bit) may become set when a critical event occurs. The critical event detecting unit 111 may detect the occurrence and resolution of the critical event by checking whether the predetermined bit becomes set or not.

When a critical event is detected by the critical event detecting unit 111, the copying unit 112 may perform a copy operation. A copy operation may include an operation of storing, into a second memory region, copied data of original data stored in a first memory region and an address of the first memory region and an operation of storing, into the first memory region, an address of the second memory region. The first and second memory regions may be among memory regions MR within the non-volatile memory device 120.

In an embodiment, the copy operation may further include an operation of generating reliability data of the copied data and an operation of storing the reliability data into the second memory region.

In an embodiment, the copying unit 112 may control the non-volatile memory device 120 to store the copied data into the second memory region through a single level cell (SLC) program operation.

When the resolution of the critical event is detected by the critical event detecting unit 111 after completion of the copy operation by the copying unit 112, the recovering unit 113 may perform a recovery operation. Specifically, a recovery operation may include an operation of reading the original data as first data from the first memory region and reading the copied data as second data from the second memory region and an operation of comparing the first and second data to recover the original data.

In an embodiment, the recovery operation may be performed when the first and second memory regions have the same reliability.

In an embodiment, the recovery operation may include an operation of keeping the copied data stored in the second memory region while deleting the original data from the first memory region when the second memory region has higher reliability than the first memory region.

In an embodiment, the recovery operation may include an operation of reading the address of the second memory region from the first memory region to identify the second memory region and an operation of reading the address of the first memory region from the second memory region to identify the first memory region.

According to a control of the controller 110, the non-volatile memory device 120 may store therein data provided from the controller 110 and may read data stored therein and provide the read data to the controller 110.

The non-volatile memory device 120 may include a plurality of memory blocks MB. The non-volatile memory device 120 may perform an erase operation in units of memory blocks MB. Each memory block MB may include a plurality of memory regions MR, The non-volatile memory device 120 may perform a program operation and a read operation in units of memory regions MR. The memory blocks MB may be non-volatile and therefore may keep data stored therein permanently.

The non-volatile memory device 120 may include a flash memory device (e.g., the NAND Flash or the NOR Flash), the Ferroelectrics Random Access Memory (FeRAM), the Phase-Change Random Access Memory (PCRAM), the Magnetic Random Access Memory (MRAM), the Resistive Random Access Memory (ReRAM) and so forth.

The non-volatile memory device 120 may include one or more planes, one or more memory chips, one or more memory dies or one or more memory packages.

Figure 2:
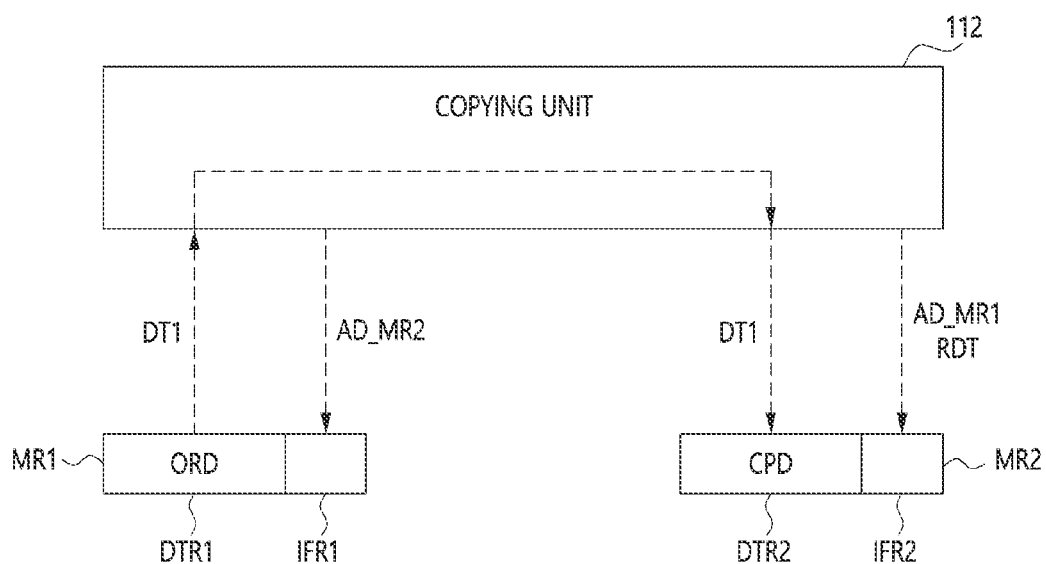
FIG. 2 is a diagram illustrating a copy operation of a copying unit of FIG. 1 in accordance with an embodiment of the present disclosure.

FIG. 2 is a diagram illustrating a copy operation of the copying unit 112 of FIG. 1 in accordance with an embodiment of the present disclosure.

Referring to FIG. 2, the copying unit 112 may perform a copy operation when a critical event is detected by the critical event detecting unit 111. Specifically, the copying unit 112 may store copied data of original data, which is stored in a first memory region MR1, into a second memory region MR2. More specifically, the copying unit 112 may read the original data ORD as first data DT1 from the first memory region MR1 and may store the first data DT1 as copied data CPD into the second memory region MR2.

In an embodiment, the first memory region MR1 and the second memory region MR2 may belong to different memory blocks.

Reliability of a memory region MR may be an ability of the memory region MR to stably keep data stored therein without deformation of the stored data. For example, a memory region MR operating as a memory region of single level cell (SLC) may have higher reliability. A memory region MR operating as a memory region of one of mufti-level cell (MLC), triple level cell (TLC), quadruple level cell (QLC) and so forth, which are higher level cells than the SLC, may have lower reliability than the memory region of SLC. For example, when the second memory region MR2 has higher reliability than the first memory region MR1, a number of bits that can be stored in a memory cell within the second memory region MR2 may be less than a number of bits that can be stored in a memory cell within the first memory region MR1.

Accordingly, in order for the second memory region MR2 to have higher reliability, the copying unit 112 may perform a copy operation through a SLC program operation. Specifically, the copying unit 112 may control the non-volatile memory device 120 to store the copied data CPD into the second memory region MR2 through a SLC program operation. As a memory region of SLC, the second memory region MR2 may store therein the copied data CPD.

In an embodiment, the original data ORD as a target of the copy operation may be predetermined. For example, the original data ORD may include firmware data, which is a part of the most important data for the memory system 100. The firmware data is most important for the memory system 100 to operate and therefore may be stored in a memory region of SLC in general. Consequently, when the copy operation is performed on the firmware data according to an embodiment, all the original data ORD and the copied data CPD may be stored in memory regions of SLC having high reliability and thus the firmware data may be effectively prevented from becoming lost or deformed.

In an embodiment, if it is possible even after completion of the copy operation for the most important data, an additional copy operation may be performed for data of lower priority. For example, when power supply to a host device is suddenly interrupted, an additional copy operation may be performed for data of lower priority if the reserved power still remains even after completion of a copy operation for data of the highest priority. For example, the data of lower priority may be user data stored in a memory region MR of TLC.

In an embodiment, a predetermined memory region may be the second memory region MR2 for storing the copied data CPD. For example, the non-volatile memory device 120 may include a memory region that is separately allocated as a buffer therefor and the separately allocated memory region may be utilized as the second memory region MR2. For example, the second memory region MR2 may include a buffer memory region MR of SLC that is configured to temporarily store data to be eventually stored into a memory region of TLC.

In an embodiment, the first memory region MR1 may include a data region DTR1 and an information region IFR1. The data region DTR1 may be designated to store therein the original data ORD. The information region IFR1 may be designated to store therein the address AD_MR2 of the second memory region MR2. The second memory region MR2 may include a data region DTR2 and an information region IFR2. The data region DTR2 may be designated to store therein the copied data CPD. The information region IFR2 may be designated to store therein the address AD_MR1 of the first memory region MR1. When storing the first data DT1 as the copied data CPD into the data region DTR2 within the second memory region MR2, the copying unit 112 may further store the address AD_MR1 of the first memory region MR1 into the information region IFR2 within the second memory region MR2 and may further store the address AD_MR2 of the second memory region MR2 into the information region IFR1 within the first memory region MR1.

In an embodiment, the copying unit 112 may generate reliability data RDT for the copied data CPD to store the reliability data RDT into the information region IFR2 within the second memory region MR2. Specifically, after reading the original data ORD as the first data DT1 from the first memory region MR1, the copying unit 112 may generate the reliability data RDT for the first data DT1 and may store the reliability data RDT into the information region IFR2 within the second memory region MR2 while storing the first data DT1 in the data region DTR2 within the second memory region MR2. The reliability data RDT may include parity data, cyclic redundancy check (CRC) data and so forth.

Figure 3:
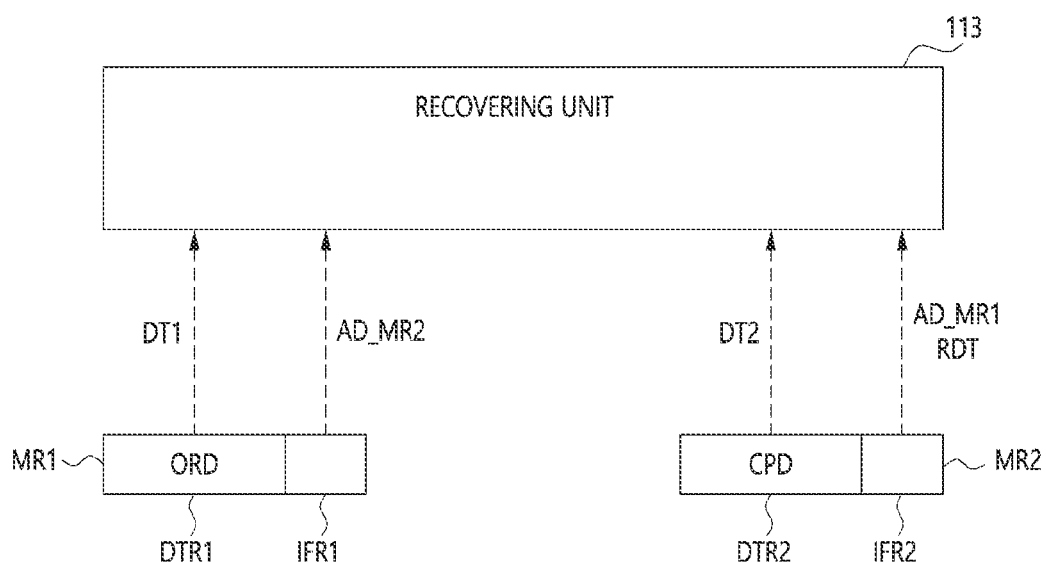
FIG. 3 is a diagram illustrating a recovery operation of a recovering unit of FIG. 1 in accordance with an embodiment of the present disclosure.

FIG. 3 is a diagram illustrating a recovery operation of the recovering unit 113 of FIG. 1 in accordance with an embodiment of the present disclosure. The recovery operation of FIG. 3 may be performed after completion of the copy operation of FIG. 2.

Referring to FIG. 3, the recovering unit 113 may perform the recovery operation when the critical event detecting unit 111 detects the resolution of the critical event. Specifically, the recovering unit 113 may read the original data ORD as first data DT1 from the first memory region MR1 and may read the copied data CPD as second data DT2 from the second memory region MR2.

In an embodiment, the recovering unit 113 may read, from the information region IFR1 within the first memory region MR1, the address AD_MR2 of the second memory region MR2 to identify the second memory region MR2 and read the second data DT2 from the second memory region MR2. That is, the recovering unit 113 may read, from the information region IFR1 within the first memory region MR1, the address AD_MR2 of the second memory region MR2 to identify the second memory region MR2 as storing therein the copied data CPD. Based on the address AD_MR2 of the second memory region MR2 that is read from the information region IFR1 within the first memory region MR1, the recovering unit 113 may read the copied data CPD as the second data DT2 from the second memory region MR2.

In an embodiment, the recovering unit 113 may read, from the information region IFR2 within the second memory region MR2, the address AD_MR1 of the first memory region MR1 to identify the first memory region MR1. Namely, the recovering unit 113 may read, from the information region IFR2 within the second memory region MR2, the address AD_MR1 of the first memory region MR1 to identify the first memory region MR1 as storing therein the original data ORD.

After reading both the first data DT1 and the second data DT2, the recovering unit 113 may compare the first data DT1 and the second data DT2 to recover the original data ORD. Specifically, when the first data DT1 and the second data DT2 are the same as each other, the recovering unit 113 may keep one (e.g., the original data ORD) stored in a corresponding one (e.g., the first memory region MR1) of the first memory region MR1 and the second memory region MR2 while deleting the other one (e.g., the copied data CPD) from a corresponding one (e.g., the second memory region MR2) of the first memory region MR1 and the second memory region MR2. When the first data DT1 and the second data DT2 are different from each other, the recovering unit 113 may compare the first data DT1 and the second data DT2 to estimate a location of an error and may correct the error by utilizing the reliability data RDT read from the second memory region MR2. When at least one of the first data DT1 and the second data DT2 has an error due to the critical event even though none of the original data ORD and the copied data CPD has an error at the beginning, the recovering unit 113 may effectively correct the error. In this case, the recovering unit 113 may store the error-corrected data into another memory region MR (not illustrated) while deleting both the original data ORD and the copied data CPD from the first memory region MR1 and the second memory region MR2, The operation of correcting an error utilizing the reliability data RDT is variously well-known and therefore will not be described in detail.

As described above, according to an embodiment, the original data ORD may be effectively recovered by utilizing the copied data CPD stored in the second memory region MR2 of the high reliability. As also described above, according to an embodiment, the addresses AD_MR1 and AD_MR2 of the first memory region MR1 and the second memory region MR2 may be alternately stored in the second memory region MR2 and the first memory region MR1 and therefore original data ORD and corresponding copied data CPD may be precisely matched to each other, even when copy operations are performed on various original data ORD, and the original data ORD may be recovered. Accordingly, the memory system may cope with data loss and data deformation more effectively.

In an embodiment, the recovering unit 113 of FIG. 3 may perform the recovery operation when the first memory region MR1 and the second memory region MR2 have the same reliability as each other. As described with reference to FIG. 4, the recovering unit 113 may perform the recovery operation when the second memory region MR2 has higher reliability than the first memory region MR1.

Figure 4:
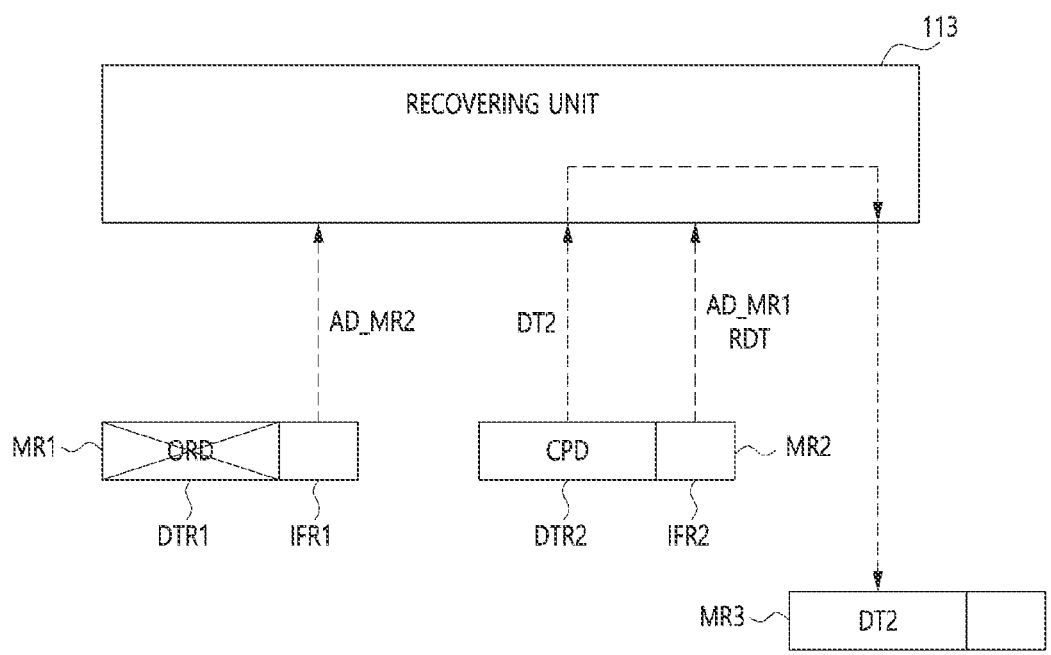
FIG. 4 is a diagram illustrating a recovery operation of a recovering unit of FIG. 1 in accordance with an embodiment of the present disclosure.

FIG. 4 is a diagram illustrating a recovery operation of the recovering unit 113 of FIG. 1 in accordance with an embodiment of the present disclosure. The recovery operation of FIG. 4 may be performed after completion of the copy operation of FIG. 2.

In an embodiment, when the second memory region MR2 has higher reliability than the first memory region MR1, the recovering unit 113 may keep the copied data CPD stored in the second memory region MR2 while deleting the original data ORD from the first memory region MR1. For example, when the first memory region MR1 is a memory region of TLC and the second memory region MR2 is a memory region of SLC, the copied data CPD may have higher reliability than the original data ORD and therefore may be kept being stored instead of the original data ORD.

In an embodiment, the recovering unit 113 may read, from the information region IFR1 within the first memory region MR1, the address AD_MR2 of the second memory region MR2 to identify the second memory region MR2 and read the second data DT2 from the second memory region MR2. The recovering unit 113 may read, from the information region IFR1 within the first memory region MR1, the address AD_MR2 of the second memory region MR2 to identify the second memory region MR2 as storing therein the copied data CPD. In an embodiment, the recovering unit 113 may read, from the information region IFR2 within the second memory region MR2, the address AD_MR1 of the first memory region MR1 to identify the first memory region MR1. The recovering unit 113 may read, from the information region IFR2 within the second memory region MR2, the address AD_MR1 of the first memory region MR1 to identify the first memory region MR1 as storing therein the original data ORD.

In an embodiment, the recovering unit 113 may further read the reliability data RDT from the second memory region MR2 to perform an error correction operation on the second data DT2 based on the reliability data RDT.

In an embodiment, the recovering unit 113 may store the second data DT2, which is read from the second memory region MR2, into a third memory region MR3.

Figure 5:
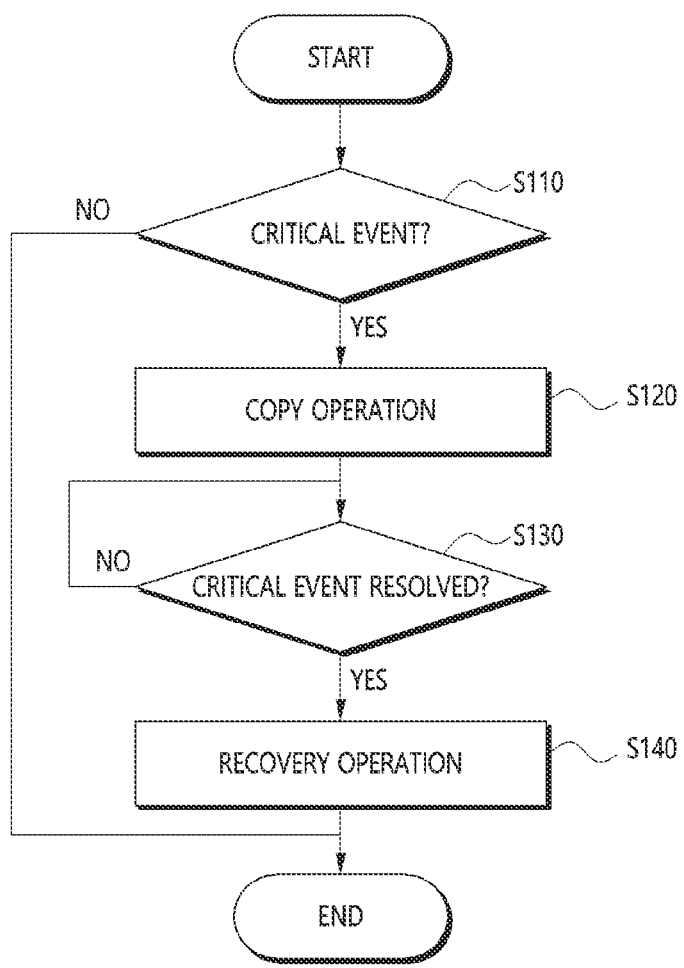
FIG. 5 is a flowchart illustrating an operation of a memory system of FIG. 1 in accordance with an embodiment of the present disclosure.

FIG. 5 is a flowchart illustrating an operation of the memory system 100 of FIG. 1 in accordance with an embodiment of the present disclosure.

In operation S110, the critical event detecting unit 111 may determine whether a critical event occurs. When a critical event occurs, the process may proceed to operation S120. When a critical event does not occur, the process may end.

In operation S120, the copying unit 112 may perform a copy operation. The copy operation may include an operation of storing, into the second memory region MR2, the copied data CPD of the original data ORD stored in the first memory region MR1 among memory regions MR within the non-volatile memory device 120. The copy operation may further include an operation of storing, into the second memory region MR2, the address AD_MR1 of the first memory region MR1 and an operation of storing, into the first memory region MR1, the address AD_MR2 of the second memory region MR2.

In operation S130, the critical event detecting unit 111 may determine whether the critical event is resolved. When the critical event is resolved, the process may proceed to operation S140, When the critical event is not resolved, the process may repeat operation S130.

In operation S140, the recovering unit 113 may perform a recovery operation. The recovery operation may include an operation of reading the original data ORD as first data DT1 from the first memory region MR1, an operation of reading the copied data CPD as second data DT2 from the second memory region MR2 and an operation of comparing the first data DT1 and the second data DT2 to recover the original data ORD. In an embodiment, when the second memory region MR2 has higher reliability than the first memory region MR1, the recovery operation may keep the copied data CPD stored in the second memory region MR2 while deleting the original data ORD from the first memory region MR1. The recovery operation may further include an operation of reading the address AD_MR2 of the second memory region MR2 from the first memory region MR1 to identify the second memory region MR2 and an operation of reading the address AD_MR1 of the first memory region MR1 from the second memory region MR2 to identify the first memory region MR1.

Figure 6:
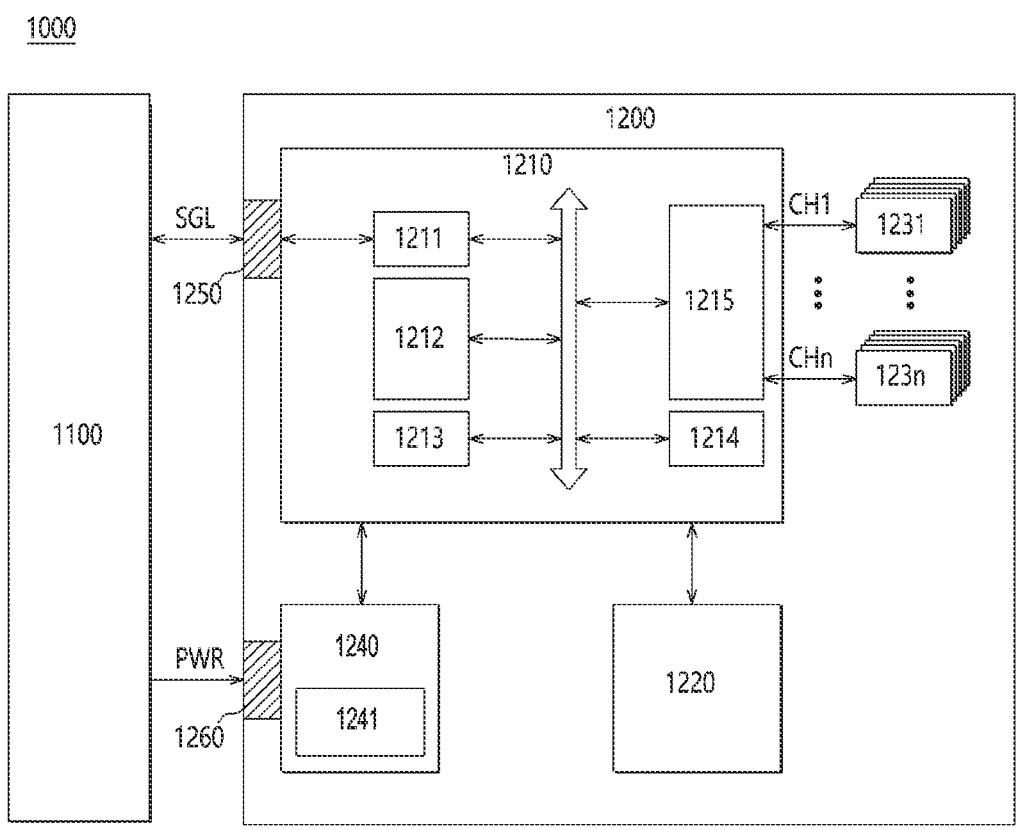
FIG. 6 is a diagram illustrating a data processing system including a solid state drive (SSD) in accordance with an embodiment of the present disclosure.

FIG. 6 is a diagram illustrating a data processing system 1000 including a solid state drive (SSD) 1200 in accordance with an embodiment of the present disclosure. Referring to FIG. 6, the data processing system 1000 may include a host device 1100 and the SSD The SSD 1200 may include a controller 1210, a buffer memory device 1220, a plurality of non-volatile memory devices 1231 to 123n, a power supply 1240, a signal connector 1250, and a power connector 1260.

The controller 1210 may control general operations of the SSD 1200. The controller 1210 may operate in the same manner as the controller 110 shown in FIG. 1.

The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100, For example, the host interface unit 1211 may communicate with the host device 1100 through one of communication standards or interfaces such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnect (PCI), PCI express (PCI-e or PCIe) and universal flash storage (UFS).

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to at least one of the non-volatile memory devices 1231 to 123n, The generated parity data may be stored together with the data in the non-volatile memory devices 1231 to 123n. The ECC unit 1214 may detect an error of the data read from at least one of the non-volatile memory devices 1231 to 123n, based on the parity data. If a detected error is within a correctable range, the ECC unit 1214 may correct the detected error.

The memory interface unit 1215 may provide control signals such as commands and addresses to at least one of the non-volatile memory devices 1231 to 123n, according to control of the control unit 1212. Moreover, the memory interface unit 1215 may exchange data with at least one of the non-volatile memory devices 1231 to 123n, according to control of the control unit 1212. For example, the memory interface unit 1215 may provide the data stored in the buffer memory device 1220, to at least one of the non-volatile memory devices 1231 to 123n, or provide the data read from at least one of the non-volatile memory devices 1231 to 123n, to the buffer memory device 1220.

The buffer memory device 1220 may temporarily store data to be stored in at least one of the non-volatile memory devices 1231 to 123n. Further, the buffer memory device 1220 may temporarily store the data read from at least one of the non-volatile memory devices 1231 to 123n. The data temporarily stored in the buffer memory device 1220 may be transmitted to the host device 1100 or at least one of the non-volatile memory devices 1231 to 123n according to control of the controller 1210.

The non-volatile memory devices 1231 to 123n may be used as storage media of the SSD 1200. The non-volatile memory devices 1231 to 123n may be coupled with the controller 1210 through a plurality of channels CH1 to CHn, respectively. One or more non-volatile memory devices may be coupled to one channel. The non-volatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 7:
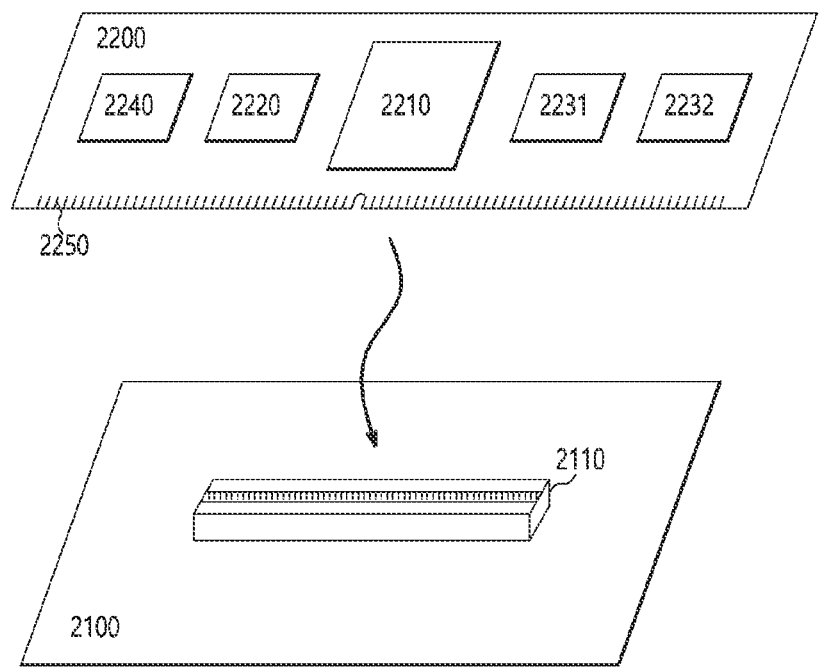
FIG. 7 is a diagram illustrating a data processing system including a memory system in accordance with an embodiment of the present disclosure.

FIG. 7 is a diagram illustrating a data processing system 2000 including a memory system 2200 in accordance with an embodiment of the present disclosure. Referring to FIG. 7, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, non-volatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 6.

The buffer memory device 2220 may temporarily store data to be stored in the non-volatile memory devices 2231 and 2232. Further, the buffer memory device 2220 may temporarily store the data read from the non-volatile memory devices 2231 and 2232. The data temporarily stored in the buffer memory device 2220 may be transmitted to the host device 2100 or the non-volatile memory devices 2231 and 2232 according to control of the controller 2210.

The non-volatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, power and signals such as commands, addresses, data and so forth may be transferred between the host device 2100 and the memory system 2200, The connection terminal 2250 may be configured into various types depending on an interface scheme between the host device 2100 and the memory system 2200. The connection terminal 2250 may be disposed on any side of the memory system 2200.

Figure 8:
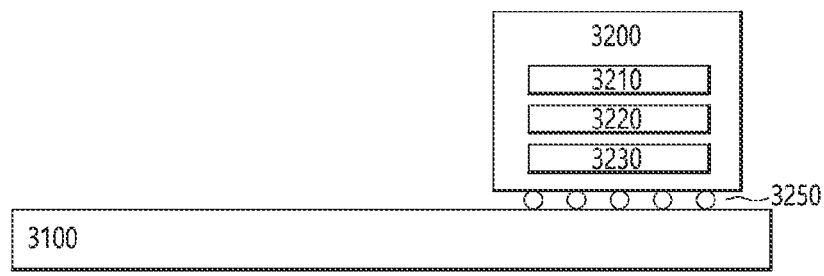
FIG. 8 is a diagram illustrating a data processing system including a memory system in accordance with an embodiment of the present disclosure.

FIG. 8 is a diagram illustrating a data processing system 3000 including a memory system 3200 in accordance with an embodiment of the present disclosure. Referring to FIG. 8, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a non-volatile memory device 3230.

The controller 3210 may control general operations of the memory system 3200. The controller 3210 may be configured in the same manner as the controller 1210 shown in FIG. 6.

The buffer memory device 3220 may temporarily store data to be stored in the non-volatile memory device 3230. Further, the buffer memory device 3220 may temporarily store the data read from the non-volatile memory device 3230. The data temporarily stored in the buffer memory device 3220 may be transmitted to the host device 3100 or the non-volatile memory device 3230 according to control of the controller 3210.

The non-volatile memory device 3230 may be used as the storage medium of the memory system 3200.

Figure 9:
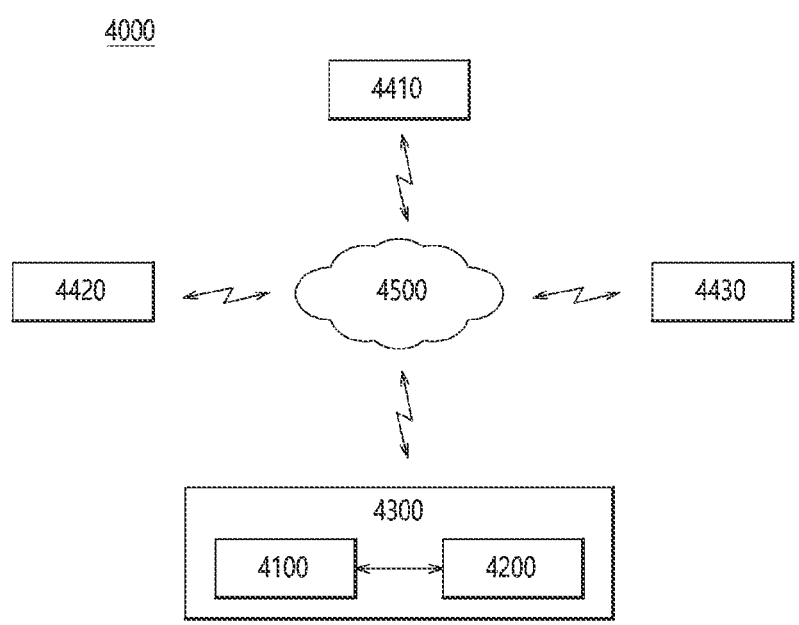
FIG. 9 is a diagram illustrating a network system including a memory system in accordance with an embodiment of the present disclosure.

FIG. 9 is a diagram illustrating a network system 4000 including a memory system 4200 in accordance with an embodiment of the present disclosure. Referring to FIG. 9, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 1, the SSD 1200 shown in FIG. 6, the memory system 2200 shown in FIG. 7 or the memory system 3200 shown in FIG. 8.

Figure 10:
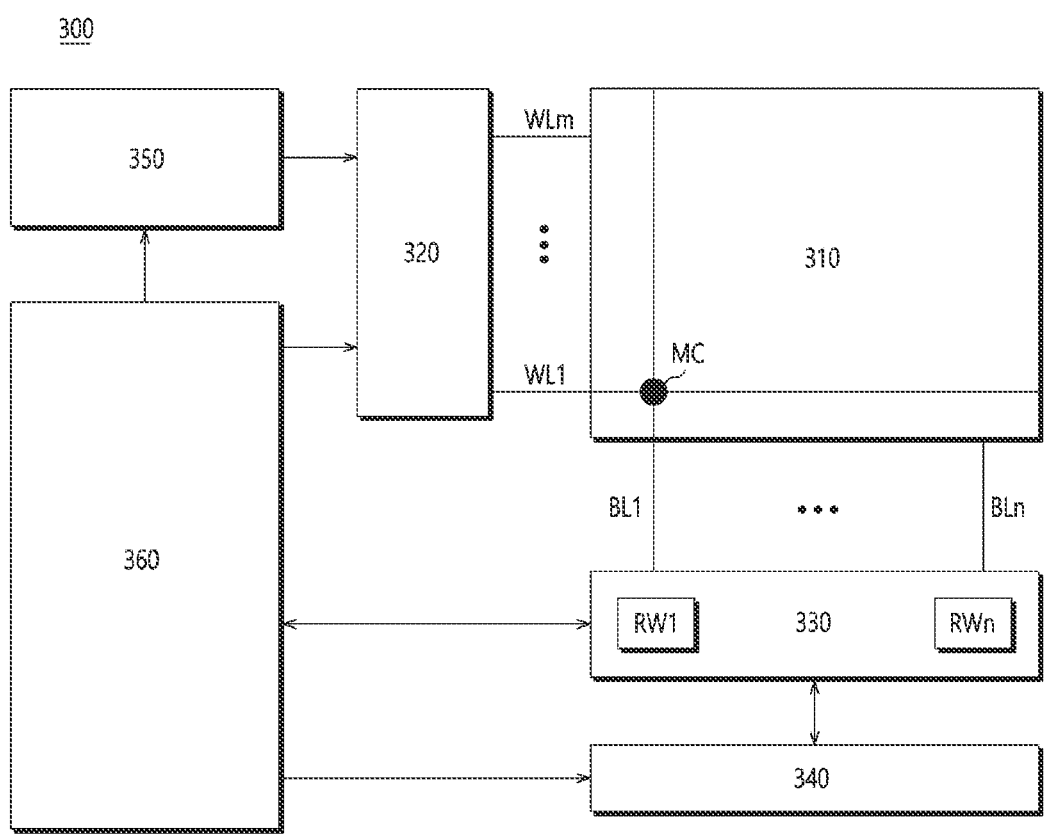
FIG. 10 is a block diagram illustrating a non-volatile memory device included in a memory system in accordance with an embodiment of the present disclosure.

FIG. 10 is a block diagram illustrating a non-volatile memory device 300 included in a memory system in accordance with an embodiment of the present disclosure. Referring to FIG. 10, the non-volatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the non-volatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the non-volatile memory device 300, based on control signals provided from the external device. For example, the control logic 360 may control operations of the non-volatile memory device 300 such as read, write and erase operations of the non-volatile memory device 300.

In accordance with an embodiment, the memory system and an operating method of the memory system may prevent loss or deformation of data due to a critical event and may effectively recover lost or deformed data.

While certain embodiments have been described above, it will be understood to those skilled in the art that the embodiments described are by way of example only. Accordingly, the memory system and operating method thereof should not be limited based on the described embodiments. Rather, the memory system and operating method thereof described herein should only be limited in light of the claims that follow when taken in conjunction with the above description and accompanying drawings. Furthermore, the embodiments may be combined to form additional embodiments.

What is claimed is:

1. A memory system comprising:
a non-volatile memory device comprising a plurality of memory regions, which are non-volatile; and
a controller configured to:
in response to detecting occurrence of a predetermined event, store copied data of original data stored in a first memory region among the plurality of memory regions and an address of the first memory region into a second memory region among the plurality of memory regions, and store an address of the second memory region into the first memory region, and
in response to detecting resolution of the predetermined event, read the address of the second memory region from the first memory region and read the copied data and the address of the first memory region from the second memory region using the address of the second memory region.

2. The memory system of claim 1, wherein the controller is further configured to generate reliability data for the copied data and store the reliability data into the second memory region.

3. The memory system of claim 1, wherein each of the first memory region and the second memory region is a memory region of a single level cell (SLC) when the original data includes data of a highest priority.

4. The memory system of claim 1, wherein the controller is further configured to:
read the original data as first data from the first memory region,
read the copied data as second data from the second memory region, and
compare the first data and the second data to recover the original data in response to detecting resolution of the predetermined critical event.

5. The memory system of claim 1,
wherein the second memory region has higher reliability than the first memory region, and
wherein the controller is further configured to keep the copied data stored in the second memory region while deleting the original data from the first memory region in response to detecting resolution of the predetermined event.

6. The memory system of claim 1, wherein the controller is further configured to identify the first memory region storing therein the original data based on the address read from the second memory region.

7. A memory system comprising:
a non-volatile memory device comprising a plurality of memory regions, which are non-volatile; and
a controller configured to:
store copied data of original data stored in a first memory region among the plurality of memory regions and an address of the first memory region into a second memory region among the plurality of memory regions,
store an address of the second memory region into the first memory region,
read, in response to detecting resolution of a predetermined event, the address of the second memory region from the first memory region,
identify the second memory region using the address of the second memory region,
recover, when the first memory region and the second memory region have the same reliability, the original data by comparing first data that is read from the first memory region with second data that is read from the second memory region, and
keep the second data while deleting the original data when the second memory region has higher reliability than the first memory region.

8. The memory system of claim 7, wherein the controller is further configured to generate, when storing the copied data into the second memory region, reliability data for the copied data to store the reliability data into the second memory region.

9. The memory system of claim 7, wherein the controller is configured to store the copied data into the second memory region through a single level cell (SLC) program operation.

10. An operating method of a memory system, the operating method comprising:
performing a copy operation in response to detecting occurrence of a predetermined event, and
performing a recovery operation in response to detecting resolution of the predetermined event,
wherein the copy operation includes:
an operation of storing copy information and copied data of original data stored in a first memory region into a second memory region, the copy information including an address of the first memory region, and
an operation of storing an address of the second memory region into the first memory region, and
wherein the recovery operation includes:
an operation of reading the address of the second memory region from the first memory region, and
an operation of reading the copied data and the address of the first memory region from the second memory region using the address of the second memory region.

11. The operating method of claim 10,
wherein the copy operation further includes an operation of generating reliability data for the copied data, and
wherein the copy information further includes the reliability data.

12. The operating method of claim 10, wherein each of the first memory region and the second memory region is a memory region of single level cell (SLC) when the original data includes data of a highest priority.

13. The operating method of claim 10,
wherein the recovery operation further includes:
an operation of reading the original data as first data from the first memory region while reading the copied data as second data from the second memory region when the first memory region and the second memory region have the same reliability, and
an operation of comparing the first data and the second data to recover the original data.

14. The operating method of claim 10, wherein the recovery operation further includes
an operation of identifying the first memory region storing therein the original data based on the address read from the second memory region.

15. The operating method of claim 10, wherein the recovery operation further includes an operation of keeping the copied data stored in the second memory region while deleting the original data from the first memory region when the second memory region has higher reliability than the first memory region.

* * * * *